United States Patent
Cok et al.

(10) Patent No.: US 7,384,816 B2
(45) Date of Patent: *Jun. 10, 2008

(54) APPARATUS AND METHOD FOR FORMING VIAS

(75) Inventors: Ronald S. Cok, Rochester, NY (US); Michael L. Boroson, Rochester, NY (US); Timothy J. Tredwell, Fairport, NY (US); Andrea S. Rivers, Bloomfield, NY (US); Dustin L. Winters, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 312 days.

This patent is subject to a terminal disclaimer.

(21) Appl. No.: 11/071,711

(22) Filed: Mar. 3, 2005

(65) Prior Publication Data

US 2006/0199476 A1    Sep. 7, 2006

(51) Int. Cl.
*H01L 51/40* (2006.01)
*H01L 21/469* (2006.01)

(52) U.S. Cl. .................. 438/99; 438/759; 438/780; 438/781; 257/E21.577

(58) Field of Classification Search .......... 438/99, 438/759, 780, 781; 257/E21.577
See application file for complete search history.

(56) References Cited

U.S. PATENT DOCUMENTS

| | | | |
|---|---|---|---|
| 5,534,071 A * | 7/1996 | Varshney et al. ........... 118/726 |
| 5,814,417 A | 9/1998 | Nagayama |
| 6,136,622 A | 10/2000 | Fukuzawa et al. |
| 6,214,651 B1 * | 4/2001 | Cox ........................... 438/141 |
| 6,683,277 B1 | 1/2004 | Millard et al. |
| 6,692,094 B1 | 2/2004 | Cok |
| 6,797,919 B1 | 9/2004 | Pichler et al. |
| 2003/0213967 A1 * | 11/2003 | Forrest et al. ............... 257/96 |
| 2004/0023253 A1 * | 2/2004 | Kunwar et al. ............... 435/6 |
| 2004/0051446 A1 | 3/2004 | Werner et al. |
| 2004/0253756 A1 | 12/2004 | Cok |
| 2005/0142974 A1 * | 6/2005 | Lee ........................... 445/24 |
| 2005/0185336 A1 * | 8/2005 | Chen et al. ................. 360/126 |
| 2006/0068173 A1 * | 3/2006 | Kajiyama et al. ........ 428/195.1 |

FOREIGN PATENT DOCUMENTS

WO    WO9903157    1/1999

OTHER PUBLICATIONS

Cok et al., U.S. Appl. No. 11/071,702, filed Mar. 3, 2005.*

* cited by examiner

*Primary Examiner*—Scott B. Geyer
*Assistant Examiner*—Seahvosh J Nikmanesh
(74) *Attorney, Agent, or Firm*—Frank Pincelli

(57) ABSTRACT

An apparatus and method for forming vias in one or more layers, comprising one or more beams located in alignment with the layers for forming one or more vias in one or more areas of the layers. A vacuum mechanism is provided for collecting ablated material caused by the directed beams forming the one or more vias, the vacuum mechanism being in fixed alignment with respect to the one or more beams such that the vacuum applies a removal force on the ablated material at the time and location when the one or more vias is being formed.

31 Claims, 8 Drawing Sheets

APPARATUS AND METHOD FOR FORMING VIAS

FIELD OF THE INVENTION

The present invention relates to organic light-emitting diode (OLED) devices and, more particularly, to an apparatus for making an OLED device with improved yields.

BACKGROUND OF THE INVENTION

Organic light-emitting diode (OLED) devices, also referred to as organic electro-luminescent (EL) devices, have numerous well-known advantages over other flat-panel display devices currently in the market place. Among these advantages are brightness of light emission, relatively wide viewing angle, and reduced electrical power consumption compared to, for example, liquid crystal displays (LCDs) using back-lighting.

Applications of OLED devices include active-matrix image displays, passive-matrix image displays, and area lighting devices such as, for example, selective desktop lighting. Irrespective of the particular OLED device configuration tailored to these broad fields of applications, all OLED devices function on the same general principles. An organic electro-luminescent (EL) medium structure is sandwiched between two electrodes. At least one of the electrodes is light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the OLED is said to be forward-biased. Positive charge carriers (holes) are injected from the anode into the EL medium structure, and negative charge carriers (electrons) are injected from the cathode. Such charge carrier injection causes current flow from the electrodes through the EL medium structure. Recombination of holes and electrons within a zone of the EL medium structure results in emission of light from this zone that is, appropriately called, the light-emitting zone or interface. The emitted light is directed towards an observer, or towards an object to be illuminated, through the light transmissive electrode. If the light transmissive electrode is between the substrate and the light emissive elements of the OLED device, the device is called a bottom-emitting OLED device. Conversely, if the light transmissive electrode is not between the substrate and the light emissive elements, the device is referred to as a top-emitting OLED device.

The organic EL medium structure can be formed of a stack of sub-layers that can include small molecule layers and polymer layers. Such organic layers and sub-layers are well known and understood by those skilled in the OLED art.

Because light is emitted through an electrode, it is important that the electrode through which light is emitted be sufficiently light transmissive to avoid absorbing the emitted light. Typical prior-art materials used for such electrodes include indium tin oxide and very thin layers of metal. However, the current carrying capacity of electrodes formed from these materials is limited, thereby limiting the amount of light that can be emitted from the organic layers.

In top-emitting OLED devices, light is emitted through an upper electrode or top electrode which has to be sufficiently light transmissive, while the lower electrode(s) or bottom electrode(s) can be made of relatively thick and electrically conductive metal compositions which can be optically opaque.

In conventional integrated circuits, bus connections are provided over the substrate to provide power to circuitry in the integrated circuit. These busses are located directly on the substrate or on layers deposited on the substrate, for example on planarization layers. In complex circuits, multiple levels of bus lines are located over the substrate and separated by insulating layers of material. For example, OLED displays such as the AM550L sold by the Eastman Kodak Company utilize multiple bus lines located on the substrate and on various planarization layers. However, these busses are not useful to provide power to the light transmissive upper electrode in an OLED device because conventional photolithography techniques destroy the organic layers and thin upper electrode necessary for a top-emitting OLED device.

Co-pending, commonly assigned U.S. Publication No. 2004/0253756, published Dec. 16, 2004 entitled "Method Of Making A Top-Emitting OLED Device Having Improved Power Distribution" proposes to solve this problem by employing a method of making a top-emitting OLED device that includes providing over a substrate laterally spaced and optically opaque lower electrodes and upper electrode busses which are electrically insulated from the lower electrodes; depositing an organic EL medium structure over the lower electrodes and the upper electrode busses; selectively removing the organic EL medium structure over at least portions of the upper electrode busses to reveal at least upper surfaces of the upper electrode busses; and depositing a light transmissive upper electrode over the organic EL medium structure so that such upper electrode is in electrical contact with at least upper surfaces of the upper electrode busses. This method will effectively provide power to the upper electrode. However, the selectively removed organic EL material may re-deposit in other areas of the EL medium structure.

There are means known in the art to avoid the re-deposition of removed or ablated material. For example, US Publication 2004/0051446 A1 entitled "Method And Apparatus For Structuring Electrodes For Organic Light-Emitting Display And Organic Light-Emitting Display Manufactured Using The Method And Apparatus" published Mar. 18, 2004 describes a method for structuring an electrode, such as, for example, a cathode and/or an anode, for an organic light-emitting display by ablating the electrodes using a laser beam. An apparatus using the method for structuring an electrode is also provided. The laser beam is expanded to cover at least one target portion of each electrode to be ablated. A method for repairing an organic light-emitting display using the method and apparatus is also provided. In some embodiments, the invention employs an exhaust unit and outlet vent. However, as described, the method is relatively slow, employing only one laser beam and the risk of re-deposition of ablated material is high since only a single exhaust unit may be employed and at some distance from the point of ablation.

WO9903157 entitled "Laser Ablation Method To Fabricate Color Organic Light Emitting Diode Displays" published 1999 Jan. 21 describes another ablation method using lasers. In this disclosure laser radiation may be used to ablate organic materials as well as metals. A method of using such laser ablation to selectively remove organic material and metal material from an organic light emitting device (OLED) work piece is also disclosed. The ablation enables fabrication of multi-color pixels in OLED displays. A novel OLED structure having adjacent multi-colored organic stakes is disclosed. Further, a novel ablation chamber in which an OLED structure may be subjected to laser ablation is also disclosed. The ablation chamber includes means for moving an OLED structure within the chamber, means for detecting an ablation endpoint, and means for suctioning ablated material from the chamber. Although a plurality of suction mechanisms are referenced in this disclosure, as illustrated, the suction mechanisms also have a significant risk of re-deposition of ablated material. Moreover, the ablation process will be relatively slow.

In an alternative approach to debris removal, U.S. Pat. No. 6,683,277 B1 and U.S. Pat. No. 6,797,919 B1 both entitled "Laser Ablation Nozzle Assembly" and issued Jan. 27, 2004 and Sep. 28, 2004 respectively, describe laser ablation systems including a first embodiment of a nozzle assembly where a laser beam is emitted through the nozzle assembly to remove materials on a target. The nozzle assembly includes a nozzle having a top end, and a window placed on the top end of the nozzle. The window includes one or more apertures and the laser beam is emitted through one of those apertures. Another laser ablation system includes a second embodiment of a nozzle assembly where a laser beam is emitted through the nozzle assembly to remove materials on a target. The nozzle assembly includes a nozzle having one or more channels at a top end of the nozzle. The nozzle assembly also includes a window that is placed on the one or more channels. A gas flows through the one or more channels and that gas flow reduces debris deposition on the window. Yet another laser ablation system includes a third embodiment of a nozzle assembly that includes a nozzle that has a central channel aligned longitudinally through which said laser beam travels from a top end of said nozzle to a bottom end of said nozzle. In this embodiment, the central channel of the nozzle is threaded. These designs for removing debris in a laser ablation system limit can clog easily and are limited in their throughput. Debris can deposit in the apertures, impeding the propagation of the laser light to a target.

There is a need, therefore for an improved method and apparatus for selectively removing material from a surface at an improved rate and with reduced contamination.

SUMMARY OF THE INVENTION

In accordance with one aspect of the present invention there is provided an apparatus for forming vias in one or more layers, comprising:

a) one or more beams located in alignment with the layers for forming one or more vias in one or more areas of the layers; and b) a vacuum mechanism for collecting ablated material caused by the directed beams forming the one or more vias, the vacuum mechanism being in fixed alignment with respect to the one or more beams such that the vacuum applies a removal force on the ablated material at the time and location when the one or more vias is being formed.

In accordance with another aspect of the present invention there is provided a method of making an OLED device comprising the steps of:

a) providing a substrate;

b) forming one or more first electrodes and electrode busses on the substrate;

c) forming one or more organic layers over the first electrodes and electrode busses;

d) ablating a plurality of areas of the material layer for forming vias using at least one beam in a chamber; and e) collecting the ablated material with a vacuum mechanism having a trap having one or more orifices, wherein the one or more orifices are located in close proximity to the plurality of areas at the time of ablation so that a collection force is applied to the debris formed during ablation of the material.

In accordance with yet another aspect of the present invention there is provided a method for forming vias in one or more layers, comprising:

a) forming one or more vias in one or more areas of the layers using one or more beams located in alignment with the layers; and b) collecting ablated material caused by the directed beams forming the one or more vias using a vacuum mechanism wherein the vacuum mechanism is in fixed alignment with respect to the one or more beams such that the vacuum applies a removal force on the ablated material at the time and location when the one or more vias is being formed.

These and other aspects, objects, features and advantages of the present invention will be more clearly understood and appreciated from a review of the following detailed description of the preferred embodiments and appended claims and by reference to the accompanying drawings.

BRIEF DESCRIPTION OF THE DRAWINGS

In the detailed description of the preferred embodiments of the invention presented below, reference is made to the accompanying drawings in which:

FIG. 4 is a close-up perspective view of the head of FIG. 3a;

The drawings are necessarily of a schematic nature since layer thickness dimensions are frequently in the sub-micrometer ranges, while features representing lateral device dimensions can be in a range from 10 micrometer to several meters. Accordingly, the drawings are scaled for ease of visualization rather than for dimensional accuracy.

DETAILED DESCRIPTION OF THE INVENTION

The present invention is directed to an apparatus and method for making vias through the organic layers of OLED devices but may be employed in any system requiring the ablation of layers of material formed on a substrate.

Figure 1:
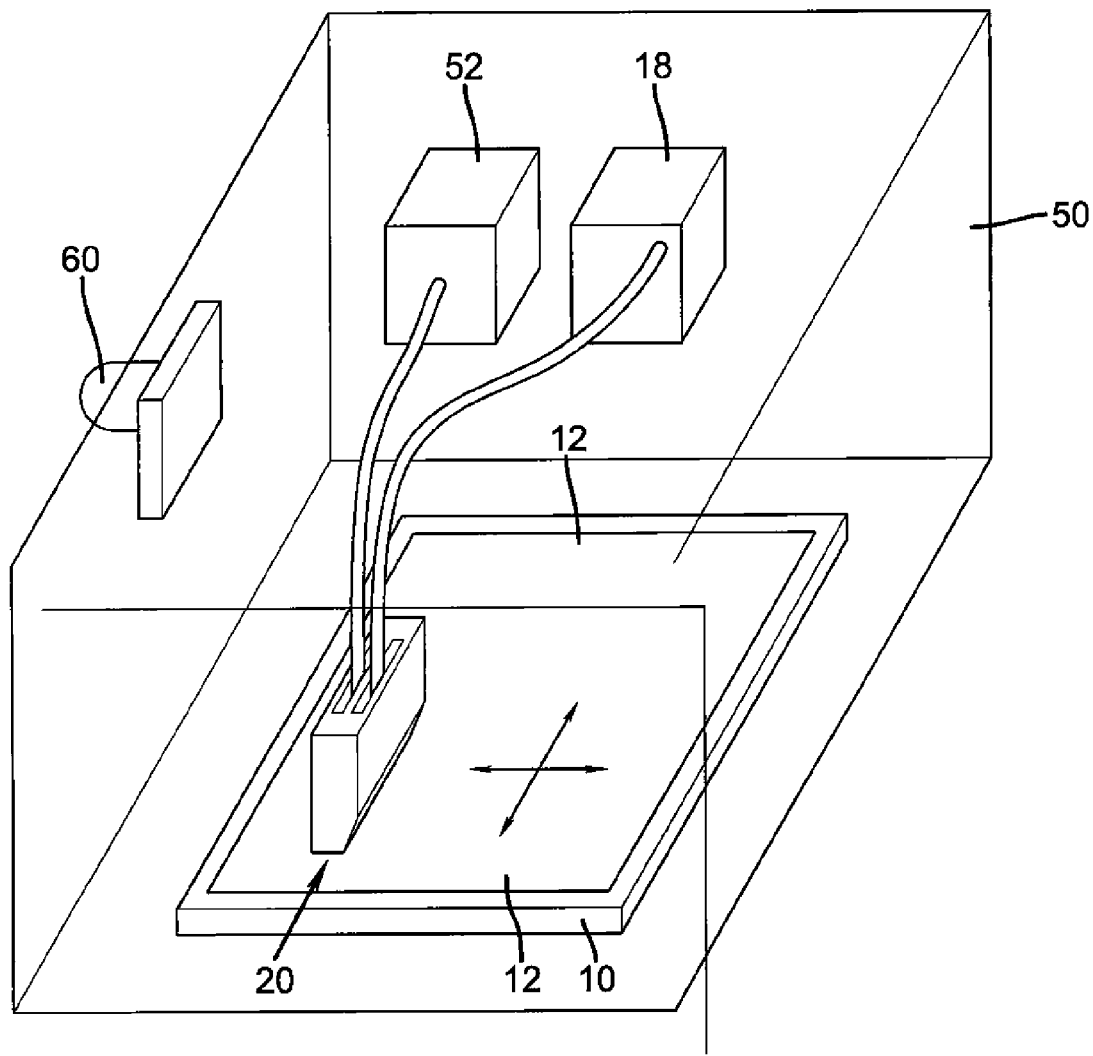
FIG. 1 is a perspective view of an apparatus according to one embodiment of the present invention.

Referring to FIG. 1, an apparatus for forming vias 30 in one or more layers 12 according to one embodiment of the present invention comprises an array of one or more beams located in alignment with the one or more layers 12 for forming one or more vias 30 (see FIG. 2) in one or more areas of the layers 12; and a vacuum mechanism for collecting ablated material caused by said directed beams forming said one or more vias, said vacuum mechanism being in fixed alignment with respect to said one or more beams such that said vacuum applies a removal force on said ablated material at the time and location when said one or more vias is being formed. The layers may comprise thin coatings of material, for example organic materials used in OLED devices, formed on a substrate 10. The array of directed beams and the vacuum mechanism may be formed in a common head 20 and located in a chamber 50 at a first atmospheric pressure. The directed beams may be created in a beam-forming device 18 external to the chamber. Likewise, orifices may be connected to a second chamber 52 external to the first chamber 50 to provide a second atmospheric pressure. Then vacuum is formed by a difference between the first and second atmospheric pressures. The head 20 and substrate 10 may move relative to each other in at least two dimensions, as indicated by the arrows.

Figure 2:
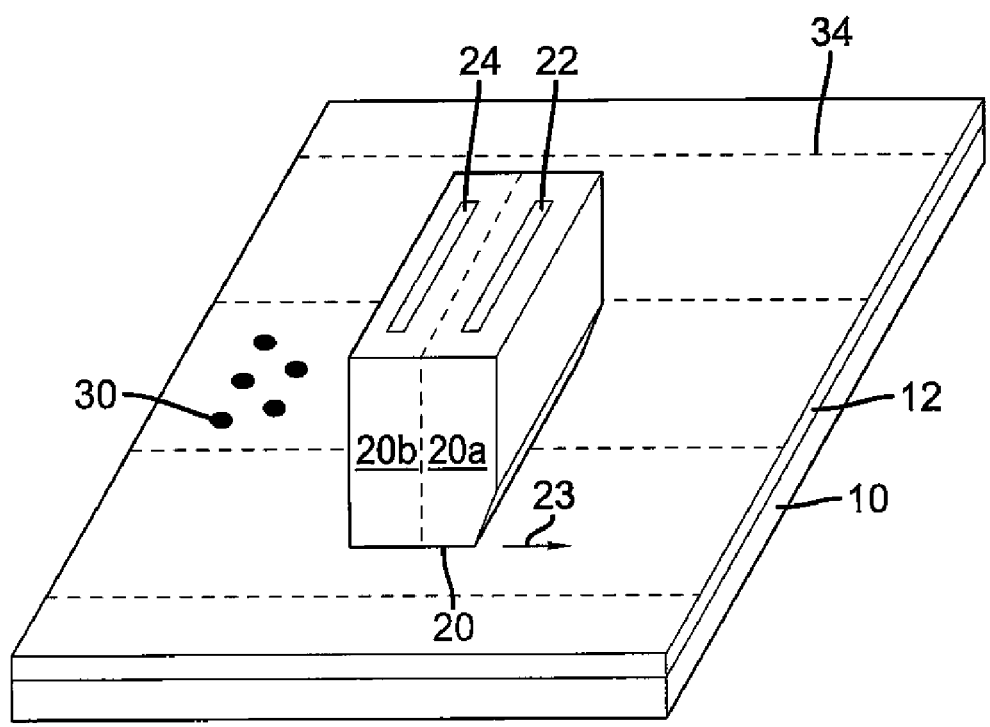
FIG. 2 is an enlarged perspective view of a portion of the apparatus of FIG. 1.

Referring to FIG. 2, the head 20 may comprise two portions located in fixed alignment. The first beam portion 20a directs the array of beams from an external source (not shown in FIG. 2) through a beam port 22 in the head 20. The second suction portion 20b captures the ablated material and removes it through a suction port 24. As shown in this embodiment, the beam portion 20a and suction portion 20b are formed in a common head 20. Each beam in the array of beams is independently controlled. The head 20 travels across the substrate 10 and layers 12 of material as indicated by the arrow 23 to selectively remove material at desired locations and form vias 30 in the material layer 12. The head 20 may not be as large or have enough beams in the array to create all the needed vias at the desired resolution in one pass across the substrate 10, so the head 20 may make multiple offset passes across the surface of the substrate 10 to selectively remove layers 12 of material one swathe 34 at a time. The head 20 moves relative to the substrate 10 in two dimensions and in alignment with the substrate 10 and material layers 12 to selectively remove material in precisely the desired locations. The head 20 may move while the substrate 10 is fixed in position or, alternatively, the substrate 10 may move while the head 20 is fixed in position, in the same or different dimensions. The head 20 may also move up or down relative to the substrate 10 to aid in locating the head 20 and array of beams relative to the material layers 12. In yet another alternative, both the substrate 10 and the head 20 may move together. Preferably, the beam portion 20a will move ahead of the suction portion 20b in the direction of travel so that the suction port 24 will move toward the ablated material as the head 20 translates across the surface of the substrate 10.

Figure 3A:
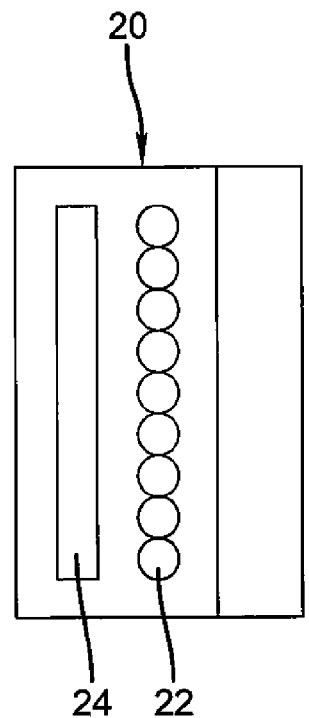
FIG. 3a is a bottom view of the head of FIG. 2 as taken along line 3-3.
Figure 3B:
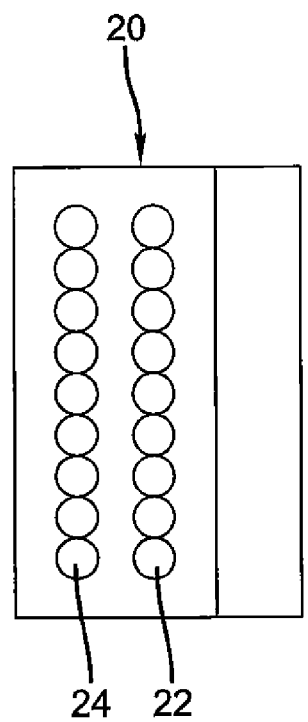
FIG. 3b is a view similar to FIG. 3a illustrating an alternative embodiment of a head according to the present invention.

FIGS. 3a and 3b illustrate bottom views of two alternative embodiments of the present invention. Referring to FIG. 3a, the head 20 includes an array of beam ports 22 for emitting an array of directed beams and a single orifice 24 with an extent slightly larger than the extent of the beam ports 22. It is desirable that the orifice be longer in length than the extent of the beam ports 22 so as to capture debris created by the periphery of the array of beams. The orifice may be rectangular (as shown) or take a variety of shapes. Referring to FIG. 3b, the head 20 includes beam port 22 and a plurality of suction ports 24 leading to orifices with one suction port 24 adjacent to each directed beam of the beam port 22 and in close association with it. The suction ports 24 trap any ablated material.

Figure 4:
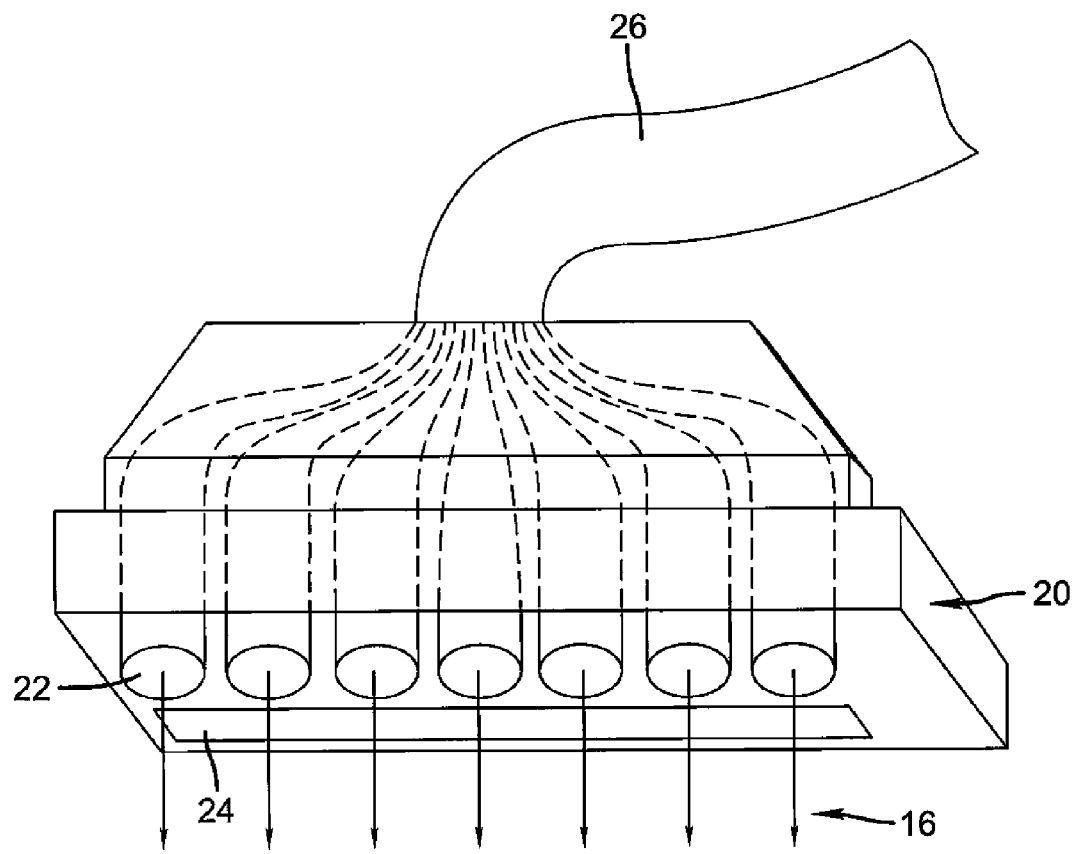

Referring to FIG. 4, in a more detailed perspective view of one embodiment of a head 20, the array of directed beams 16 may be provided through a plurality of beam ports 22 fed from a cable 26 of multiple fibers. In this embodiment, the beams may be laser beams generated externally to the chamber 50 in a beam-forming device 18 (shown in FIG. 1). However, the present invention is not limited to this case, and the beams may also be laser beams generated internally to the chamber. Also, the use of a fiber for directing the beam is not always required for successful practice of the present invention.

Figure 5:
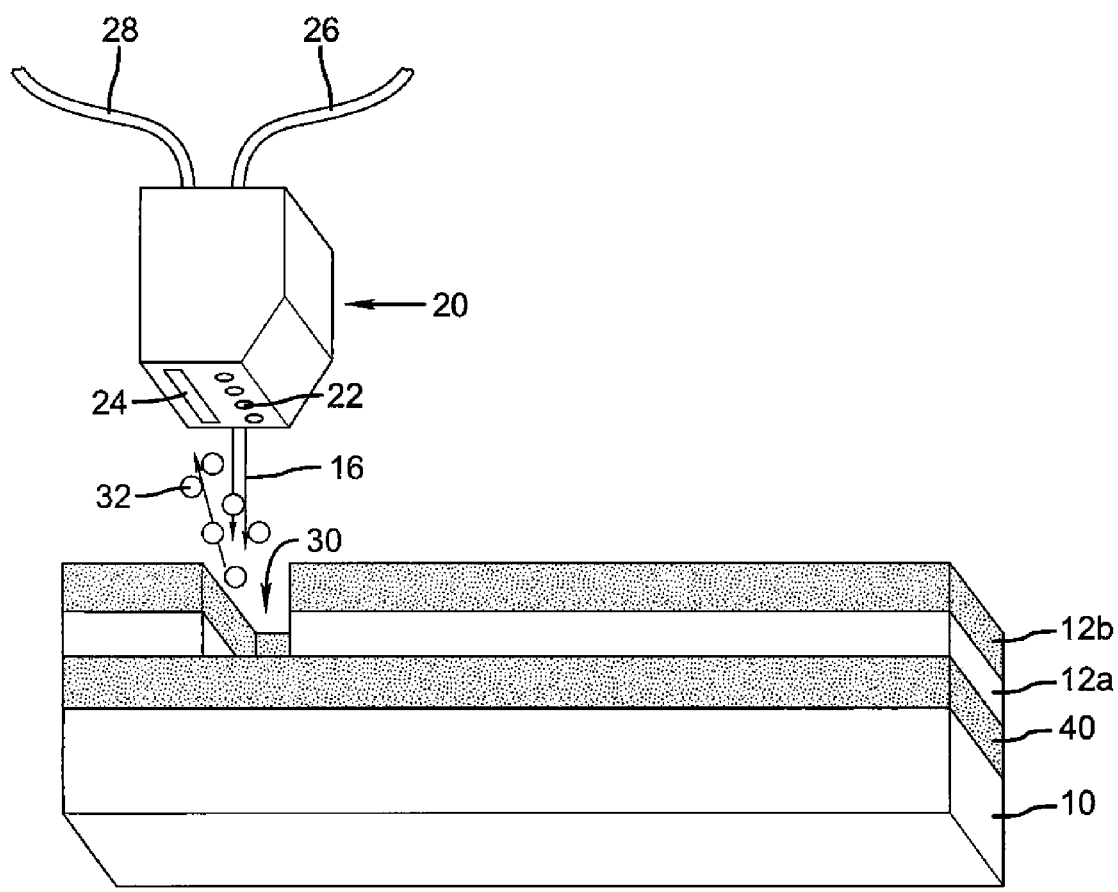
FIG. 5 is a perspective view of one embodiment of the present invention employed to ablate material from a substrate using a head having a beam portion and a suction portion located on the same side of as substrate from which material is being removed.

FIG. 5 illustrates one embodiment of the present invention in operation. Referring to FIG. 5, a substrate 10 has a first metal electrode 40 formed over the substrate 10. Two material layers 12a and 12b are deposited over the electrode 40. A head 20 located in alignment with the substrate 10 and material layers 40, 12a, and 12b having beam ports 22 and a suction port 24 forms a plurality of directed beams 16 that ablate a via 30 in material layers 12a and 12b. The directed beams 16 may be formed externally to the chamber 50 and are switched on or off to ablate material 32 at the desired locations only. The ablated material 32 is captured by the suction port 24 and removed from the chamber 50 by a vacuum hose 28 and conducted to a low-pressure chamber 52. The electrode layer 40 is not ablated because it does not absorb the directed beam and is more robust in the presence of the beams 16. The layer 40 may include additional coatings intended to assist in ablating the material layers above it, for example materials chosen to absorb the energy from the beams and heat the material layers.

The suction port 24 and the portions of the head 20 as well which may be contacted by the ablated material as vacuum hose 28 may be heated to prevent condensation of the ablated material within the head or hose. Low-pressure chamber 52 or a portion thereof may then be cooled to collect the ablated material. Access to this cooled collection area may be provided for periodic removal and maintenance by an operator.

Figure 6:
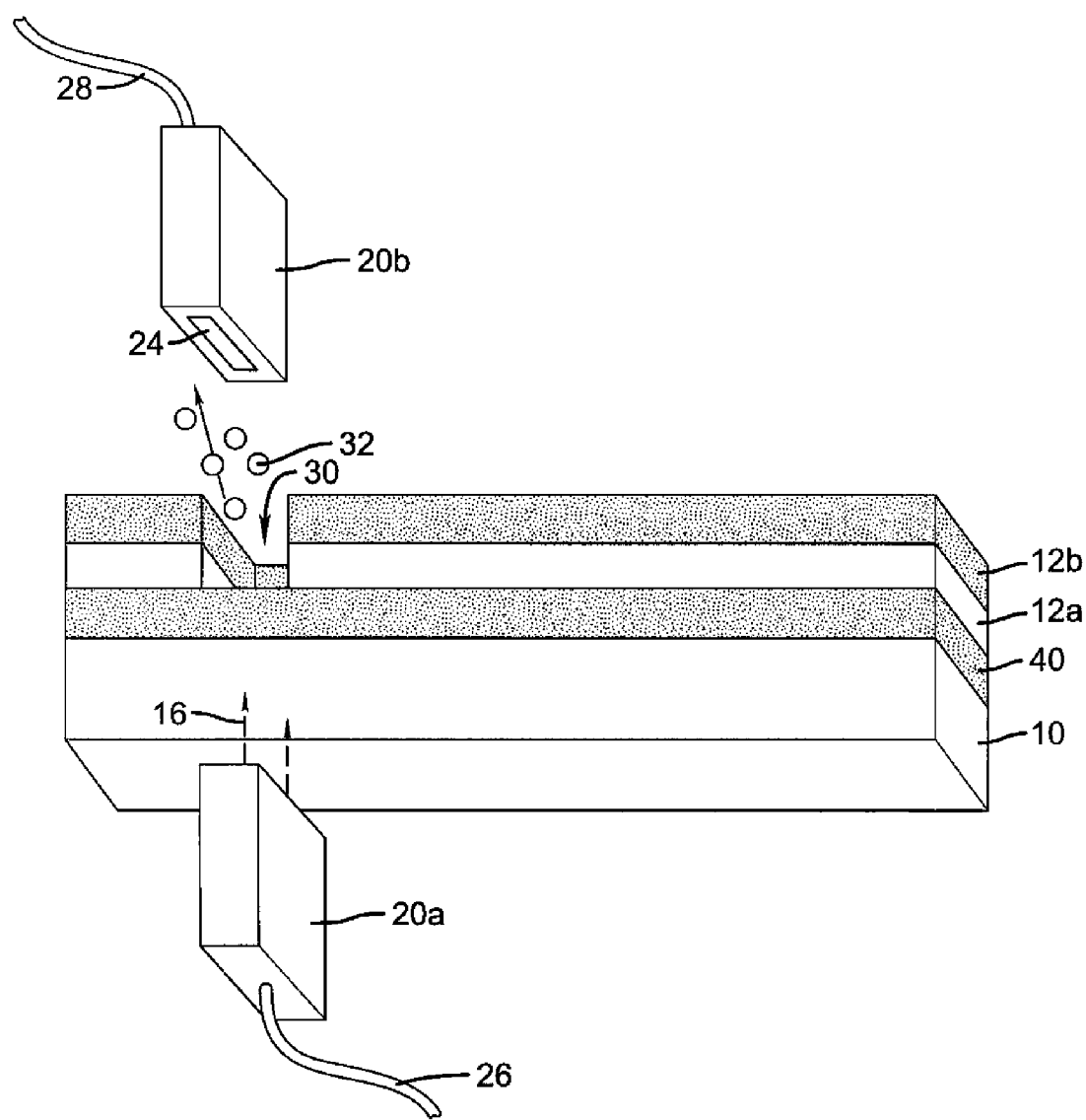
FIG. 6 is a perspective view of an alternative embodiment of the present invention employed to ablate material from a substrate wherein a head having a beam portion is positioned on one side of the substrate and a second head having a suction portion is positioned on opposite sides of the substrate.

The embodiment of FIG. 5 uses an array of directed beams 16 that pass into the material layers 12a and 12b to be ablated without passing through the substrate 10. In an alternative embodiment, the beams 16 may pass through the substrate. Referring to FIG. 6, the beam ports 22 and the suction ports 24 are held in fixed alignment but are not formed in a common head. The directed beams 16 are emitted from the beam ports in the beam portion 20a and pass through the substrate 20. In this case, the substrate may be transparent to the beams and any underlying layers (such as electrode 40) before striking the material layers 12a and 12b to be ablated. Alternatively, the electrode 40 may not be transparent and may be heated by the beams and thereby cause the material to ablate. The suction ports 24 remove any ablated material by evacuating the atmosphere in the chamber 50 and entraining the ablated material 32 so that it is removed with the atmosphere. As illustrated in FIG. 1, additional quantities of atmosphere may be supplied through an atmosphere port 60 to maintain a constant pressure in the chamber 50. In either the configuration of FIG. 5 or FIG. 6, the beam portion 20a and suction portion 20b are in fixed alignment and are moved relative to the substrate 10 and under common control with the optical beams 16 to ablate only the areas desired. The atmosphere may flow across the surface of the material layers to further enhance the removal of entrained ablated materials. Such a flow may be maintained by coordinating the suction of atmosphere through the suction port 26 with the ingress of atmosphere through the atmosphere port 60. Multiple ports 60 may be employed.

The present invention improves the throughput of any ablating via-formation system by providing a plurality of beams that can ablate material at the same time. Since the present invention may be employed in manufacturing display devices such as OLED displays and since a via may be needed for every pixel in a display, a large number of vias may be necessary, for example more than 10,000. The present invention also reduces the possibility of contamination due to re-deposition of ablated material by locating suction orifices in alignment with the ablating beams and close to the location of material ablation.

The atmosphere in the chamber 50 may be inert to the directed beams and to the material layers so that additional by-products of the ablation process are avoided. For example, nitrogen or carbon dioxide may be employed.

The directed beams of the present invention may be optical beams. A variety of frequencies may be employed (for example, visible, infrared or ultraviolet). The frequencies chosen are selected to optimize the ablation of material and are typically absorbed by the material or any absorptive coating underlying the layers of material to be ablated. If material exposure is performed through the substrate, the substrate should be largely transparent to the frequencies employed. Exposure may also be made by any underlying substrate carrier that is transparent, or has a window that is transparent, to the frequencies employed. If the chamber 50 has a window that is transparent to the frequencies employed, exposure may also be performed through the window.

While any optical beam of sufficient energy may be employed to ablate the layers of material to form vias, laser beams may be advantageously utilized. Optical fibers capable of transferring laser beams effectively from one location to another are well known, as are optical elements for focusing the beams, solid-state means to generate the laser light, and electronic controls for controlling the generation and intensity of laser light, thereby enabling the ablation of material at the desired locations only. The beams can be formed in a common integral optical head, as shown, or may comprise separate elements located in alignment. Optical elements may be employed to focus the beams onto the desired location with a spot size and shape of the desired size and shape.

The substrate may be oriented vertically in the chamber 50 to assist in preventing ablated material from re-depositing and contaminating the surface of the material layers. In this configuration the top surface of the substrate containing the material layers is disposed approximately 90 degrees to the force of gravity. In this orientation, the head may move upward so that ablated material will tend to fall in the direction of the suction port. Such an orientation is also preferred so as to reduce curvature of the substrate with respect to gravity to facilitate location of the beam with respect to the selected areas to be removed. Alternatively, the substrate may be located horizontally with the layers of material to be ablated located below the substrate so that any ablated material will fall away from the substrate and layers of material. Alternately the substrate may be orientated at an angle between the horizontal and vertical positions described. Finally, some advantage may still be achieved by orientating the substrate at an angle greater than 90 degrees with respect to the force of gravity to as much as 100 degrees.

Figure 7:
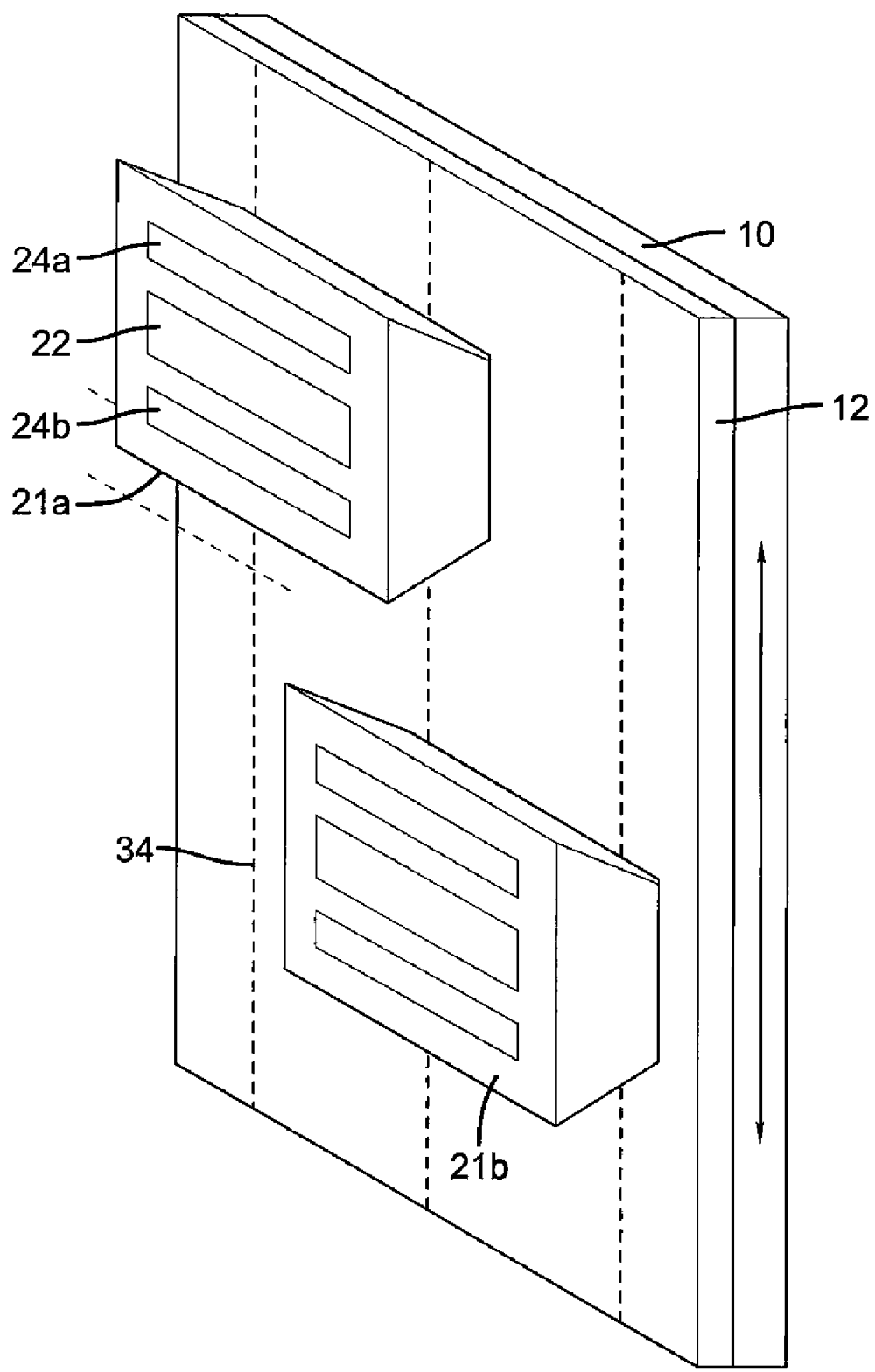
FIG. 7 is a perspective view of an alternative embodiment of the present invention having a pair of heads each having a vertical orientation and which move in a bi-directional path.

Referring to FIG. 7, the substrate 10 is oriented vertically. In this embodiment, a plurality of bi-directional heads 21a and 21b are illustrated. Each head 21a and 21b is located in strict alignment with each other so as to ablate material in adjacent, aligned swathes 34. The heads 21a and 21b can move bi-directionally so that vias may be made at higher resolution or a higher throughput achieved. To enable this bi-directional movement, an additional suction port 24b is provided on the side of the optical port 22 opposite a first suction port 24a. As the substrate 10 and heads 21a and 21b move relative to each other, one suction port may not be employed. For example, as the heads 21a and 21b move upward, the suction port 24a may not be employed while suction port 24b is employed. Likewise, when the heads 21a and 21b move downward, the suction port 24b may not be employed while suction port 24a is employed. This bi-directional configuration may be applied when the substrate 10 is at any angle and is not restricted to use in the vertical orientation shown in FIG. 7. Moreover, both suction ports 24a and 24b may be used together to provide improved debris collection.

In an additional embodiment of the present invention, the beam may be a beam of particles, for example comprising particles suspended in a compressed fluid wherein the particles become free of the compressed fluid prior to contact with the material layer. Such a beam, together with control mechanisms, is described in U.S. Pat. No. 6,692,094 issued Feb. 17, 2004. A plurality of such beams may be employed from a common reservoir to provide an array of beams capable of ablating layers of material in a controlled manner.

While the present invention may be employed to remove a variety of materials in one or more layers from a variety of substrates, it is anticipated that the invention may be useful in the manufacture of organic light emitting diode (OLED) devices such as displays. In this case, the layers of material to be removed may be organic materials employed in the construction of OLED devices, such as are well known in the art. Additional layers may be deposited after the vias are formed to create completed, useful devices. A process useful for the construction of OLED devices and that may employ the present invention is described in U.S. Publication 2004/0253756 published Dec. 16, 2004 entitled "Method Of Making A Top-Emitting OLED Device Having Improved Power Distribution".

The organic EL medium structure is relatively thin (for example, less than 1000 nm) and is readily selectively removed. The structure is relatively transparent but absorbs light or energy at selected wavelengths. The electrodes are typically made of a metal, metal alloy, or of a sandwich configuration of metals, and as such exhibit a level of optical reflectivity. Due to this reflectivity, the ablation process is stopped at the electrodes, thus preventing ablation beyond the removal of the organic EL medium structure. Organic EL media are known to degrade in the presence of oxygen and moisture. Therefore, it is desirable that the substrate and the suction portion be located in an environment that is inert. Such an environment may be composed primarily of Nitrogen, Argon, Helium or the like.

Following the selective removal of the organic EL medium structure, additional steps may be performed to complete the OLED device. For example, a second metallic layer may be deposited over the organic layer to complete the OLED structure or the OLED maybe encapsulated. From the time that the first organic EL medium layers are deposited until the OLED device has been completed and the organic layers are sealed from exposure to the environment, exposure to oxygen and moisture must be avoided. For this reason, OLED devices are frequently manufactured in multi-chamber sealed environment tools. As such the laser ablation chamber of the present invention is preferably capable of receiving and returning the OLED device substrate to the sealed environment manufacturing tool.

Figure 8:
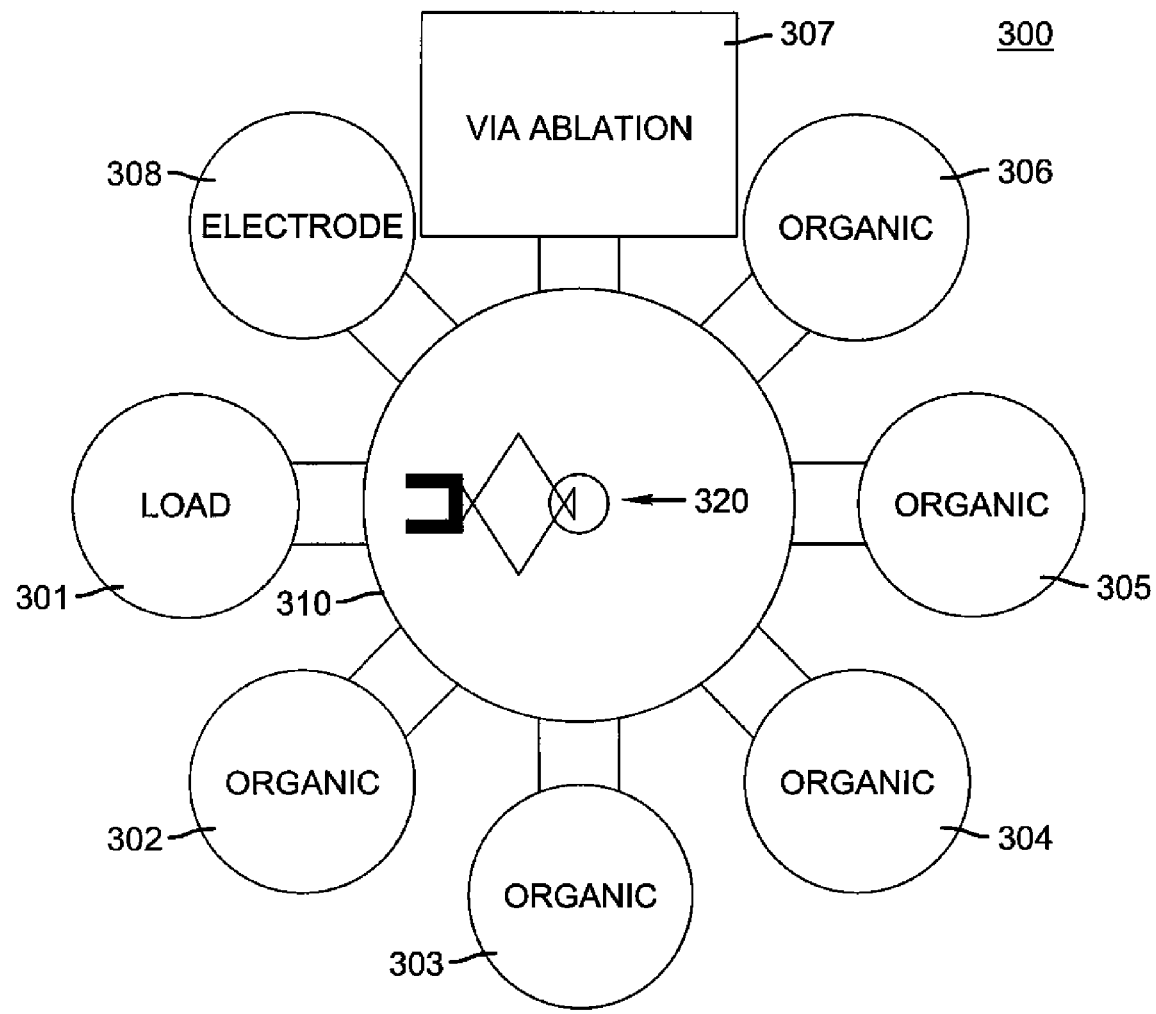
FIG. 8 is an illustration of a manufacturing tool for producing OLED devices according to an embodiment of the present invention.

A manufacturing tool 300 incorporating an ablation system according to one embodiment of the present invention is shown in FIG. 8. FIG. 8 illustrates cluster tool arrangement where a work piece moves through various work station where a different operation is conducted at each station. The manufacturing tool 300 is configured to receive substrates (not shown) by means of a load chamber 301. The load chamber removes any oxygen or moisture-containing environment by a vacuum pumping means (not shown) known in the art. The environment is maintained at a reduced pressure or replaced with an inert environment. The substrate is then moved from the load chamber 301 into a transfer chamber 310 by a substrate movement apparatus/mechanism 320. This substrate movement apparatus 320 may for example be a robotic arm. The substrate is then moved into one or more organic deposition chambers such as organic deposition chamber 302, organic deposition chamber 303, organic deposition chamber 304, organic deposition chamber 305, and organic deposition chamber 306 where the multiple organic layer are deposited. Following deposition of the organic layers, the substrate is moved into the via ablation chamber 307 which contains the vacuum mechanism for removing debris and where the substrate is exposed to the beam portion for selective removal of the organic layers. The ablation chamber may comprise vacuum mechanism and cutting beams as previously described. Upon complete of the selective removal, the substrate is then moved to the electrode deposition chamber 308 for deposition of a metal layer. Additional chambers (not shown) for encapsulation may also be provided. The substrate is then removed by means of the load chamber 301 or a similar additional chamber (not shown). This configuration, whereby each process chamber is connected by one or more transfer chambers, is referred to as a cluster manufacturing tool configuration. Alternately, each chamber for subsequent process steps may be arranged to connect to one another so that the substrate is passed directionally from one chamber to the next in the desired order of the process steps without the need for a transfer chamber. Such an alternate configuration is referred to as an in-line manufacturing tool configuration. In order for each chamber to be operated at different pressures, it is preferable that each chamber is separated from the transfer chamber or from other connected chambers by a gate valve which opens during substrate transfers and is capable of being closed during processing.

The invention has been described in detail with particular reference to certain preferred embodiments thereof, but it will be understood that variations and modifications can be effected within the spirit and scope of the invention. It will be understood that the method of the present invention is applicable for different classes of OLED devices such as polymer OLED devices (either active- or passive-matrix), top-emitting passive-matrix OLED devices, and top-emitting active-matrix OLED devices.

PARTS LIST 10 substrate
12, 12a, 12b layer of material
16 array of beams
18 beam-forming device
20 head
20a beam portion
20b suction portion
21a, 21b bi-directional head
22 beam port
23 arrow
24, 24a, 24b suction port
26 fiber cable
28 vacuum hose
30 via
32 ablated material
34 swathe
40 electrode layer
50 first pressure chamber
52 second pressure chamber
60 atmosphere port
300 manufacturing tool
301 load chamber
302 organic deposition chamber
303 organic deposition chamber
304 organic deposition chamber
305 organic deposition chamber
306 organic deposition chamber
307 ablation chamber
308 electrode deposition chamber
310 transfer chamber
320 substrate movement apparatus

What is claimed is:

1. A method of making an OLED device comprising the steps of:
    a) providing a substrate;
    b) forming one or more first electrodes and electrode busses on the substrate;
    c) forming one or more organic layers over the first electrodes and electrode busses;
    d) ablating a plurality of areas of the material layer for forming vias using at least one beam in a chamber; and
    e) collecting the ablated material with a vacuum mechanism having a trap having one or more orifices, wherein said one or more orifices are located in close proximity to said plurality of areas at the time of ablation so that a collection force is applied to the debris formed during ablation of said material.

2. The method of claim 1 wherein said at least one beam and said vacuum mechanism are provided in a chamber.

3. The method of claim 2 wherein said chamber includes an inert atmosphere.

4. The method of claim 3 wherein said atmosphere is nitrogen, argon, helium or carbon dioxide.

5. The method of claim 2 wherein said atmosphere flows across the surface of the material layers.

6. The method of claim 1 wherein said vacuum mechanism comprises at least one orifice(s).

7. The method of claim 6 wherein the at least one orifice comprises an array of orifices and each orifice is located adjacent each beam.

8. The method of claim 6 wherein said orifice is a single orifice.

9. The method of claim 1 wherein at least one or more beams and said vacuum mechanism are formed in an integral head.

10. The method of claim 9 wherein a portion of said head is heated and includes said one or more beams.

11. The method of claim 9 wherein a portion of said head that comprises said vacuum mechanism is cooled.

12. The method of claim 9 wherein said vacuum mechanism includes a trap that moves with respect to the substrate and material layer and in alignment with the beams.

13. The method of claim 12 wherein said substrate is oriented vertically and the direction of motion of the vacuum mechanism is substantially vertical.

14. The method of claim 9 wherein said vacuum mechanism includes at least one orifice on either side of the array of directed beams.

15. The method of claim 9 wherein said integral can move bi-directional.

16. The method of claim 1 wherein the at least one beam comprises at least one optical beam.

17. The method of claim 16 wherein the at least one optical beam is a laser beam.

18. The method of claim 16 wherein the at least one beam each include an optical element for focusing light on the layer.

19. The method of claim 16 wherein said optical beams comprise one of the following: ultraviolet, infrared, or visible light.

20. The method of claim 16 further comprising a substrate on which said one or more layers are provided, wherein the substrate is transparent so as to permit the frequency of optical beam radiation and the optical beam radiation to travel through the substrate and the vacuum mechanism is located on the opposite side of said substrate from the at least one optical beam.

21. The method of claim 1 wherein the at least one beam moves with respect to the one or more layers.

22. The method of claim 1 wherein the at least one beam comprises a beam of particles.

23. The method of claim 22 wherein said particles are suspended in a compressed fluid wherein the particles become free of the compressed fluid prior to contact with the material layer.

24. The method of claim 1 wherein said substrate and vacuum mechanism are oriented vertically.

25. The method of claim 1 wherein said substrate is oriented horizontally with the substrate above the material layer.

26. The method of claim 1 wherein said material is organic material.

27. The method of claim 26 wherein said layers form an organic light emitting diode.

28. The method of claim 1 wherein the at least one beam is independently controlled.

29. The method of claim 1 wherein said apparatus is provided in a cluster manufacturing tool configuration.

30. The method of claim 1 wherein said apparatus is provided in an in-line manufacturing tool configuration.

31. The method of claim 1 further comprising a chamber containing the substrate and wherein the beams pass through a window in the chamber.

* * * * *